United States Patent
Terrell et al.

(10) Patent No.: US 6,839,965 B2
(45) Date of Patent: Jan. 11, 2005

(54) METHOD OF MANUFACTURING A RESISTOR CONNECTOR

(75) Inventors: Scott Patrick Terrell, Boise, ID (US); Clifton Jay Seusy, Boise, ID (US); Robert Calhoun Cannon, Caldwell, ID (US); Darrell Kent Mason, Eagle, ID (US); Brandon Chad Bailey, Boise, ID (US); Douglas G. Hastings, Meridian, ID (US)

(73) Assignee: R-TEC Corporation, Boise, ID (US)

( * ) Notice: Subject to any disclaimer, the term of this patent is extended or adjusted under 35 U.S.C. 154(b) by 0 days.

(21) Appl. No.: 10/360,575

(22) Filed: Feb. 6, 2003

(65) Prior Publication Data

US 2004/0154827 A1 Aug. 12, 2004

(51) Int. Cl.[7] ................................................ H01K 3/10
(52) U.S. Cl. .............................. 29/852; 29/831; 29/846; 29/847; 29/848; 174/255; 174/264; 361/792
(58) Field of Search ........................... 29/852, 831, 846, 29/847, 848; 174/255, 264; 361/792

(56) References Cited

U.S. PATENT DOCUMENTS

| | | | |
|---|---|---|---|
| 6,370,012 B1 * | 4/2002 | Adae-Amoakoh et al. ........................ | 361/306.3 |
| 6,376,049 B1 * | 4/2002 | Asai et al. ................... | 428/209 |
| 6,591,495 B2 * | 7/2003 | Hirose et al. .................. | 29/846 |
| 6,630,743 B2 * | 10/2003 | Magnuson et al. ......... | 257/774 |

* cited by examiner

Primary Examiner—Carl J. Arbes
Assistant Examiner—Tim Phan
(74) Attorney, Agent, or Firm—Robert L. Shaver; Frank J. Dykas; Dykas, Shaver & Nipper, LLP

(57) ABSTRACT

A method for making electrical interposers which includes the use of a stencil which is thicker than designated lower contact pads and which defines a stencil passage corresponding to each lower contact pad of each interposer. The stencil is attached to a bottom surface of an insulative layer and a conductive elastomeric material is applied to the stencil, so that the stencil passages are filled with said conductive elastomeric material. When this material has been adequately placed within the stencil passages the stencil is removed thus leaving each lower conductive pad with an attached conductive elastomeric pad.

14 Claims, 10 Drawing Sheets a) Metal pinch contact b) Metal 'Y' contact c) Rough bump on flex d) Conductive polymer bump on ceramic e) Etched pocket in silicon f) Metal probe

METHOD OF MANUFACTURING A RESISTOR CONNECTOR

BACKGROUND OF THE INVENTION

1. Field of the Invention

The present invention generally relates to interposers, and more particularly relates to an interposer particularly suited to highly miniaturized applications, a method for making the interposer, and an interposer made by a method.

2. Background Information

Interposers are devices used with electrical components to provide an electrical pathway from one electrical component to another. They are typically about the size of a postage stamp, and contain arrays of small contacts (each contact being one interposer) which are placed over one electrical component, so that a second electrical component can be placed in contact with the interposer for full electrical contact between the two components. Interposers may be used in a testing situation in which numerous electrical components are to be connected to a testing device. Interposers can also be used in a situation where an electrical component is to be interchangeable or replaceable, in order to make replacement easier.

One particular type of contact that needs to be contacted by interposers is a solder ball. This is a generally semi-spherical shaped ball, which forms the electrode of one electrical component, such as a silicon chip. The electrical connections of an interposer need to be able to contact the solder ball, and possibly correct centering problems and also form a good electrical connection in spite of the possibility of a layer of oxidation being present on the solder ball. As solder balls on electrical components have become increasingly smaller, the present technology to make interposers that make a clean and efficient connection to such solder balls has been surpassed. Several ways are utilized to try to make a good connection with solder balls. These include a metal pinch contact, which is like the tips of a very small pair of tweezers fitting around the solder ball. Another variation on this approach is a connection in which the tips that fit around the solder ball are generally shaped like small spoons, and fit the contours of the sides of the solder ball. Another approach to this problem is the metal "y" contact. Still another interposer design to contact the solder ball is by using a contact of elastomeric material with metallic beads suspended in the material, which form a rough surface for contacting the ball. A similar approach is to use a conductive polymer bump mounted on ceramic. Another approach is to form a pocket etched in silicon. Still another approach is to use a metal probe that contacts the solder ball. Such a metal probe can have a pocket into which part of the solder ball can fit.

These approaches have proven to be only partially successful. A problem with them is that the smallest scale that these devices can be built is a scale in which the center of the balls is approximately 0.75 millimetres (mm) apart. This is called a 0.75 mm pitch array. In such an array, the solder balls are approximately 0.35 mm in diametre. As solder balls become smaller, a 0.65 mm pitch array and even smaller pitch arrays are preferable, and an interposer must be designed that can interface with such a pitch array. Current technologies are unable to achieve a good connection with a pitch array of less than 0.75 mm.

One approach to achieving a good connection between the contact pad of an interposer and a solder ball is to have the contact pad include a hollow space, or well, in the center. This well is achieved in the current technology by drilling a hole through the interposer. This results in an interposer with a through hole. On the side of the interposer opposite from the side that contacts the solder ball, an elastomeric pad is often attached to the lower contact surface. The elastomeric material is filled with metallic balls that create an electrical connection. The ability of the elastomeric pad to flex slightly allows the lower surface of the interposer to compensate for co-planarity problems of a chip or testing machine. The problem with this type of an interposer is that the elastomeric material is inevitably subjected to heat. When a chip is being tested, it is tested in an environment of approximately 125 degrees Centigrade. When a chip is under this temperature, its electrical circuitry is tested. Thus the testing equipment must be able to also survive that temperature. In this temperature range, volatile elements of the elastomeric material tend to off gas. As the elastomeric material emits these volatile gases, an interposer with a through hole will allow these off gases to pass through the interposer and contact the solder balls. They can be deposited on the solder ball, and result in poor electrical connections when the chip is used in its final application. Thus, a hole through the interposer is undesirable, but a well on the surface of the interposer that contacts the solder ball is desirable. An elastomeric pad is also desirable.

Therefore, it is an object of the present invention to make an interposer that is suitable for use with the new generation of smaller pitched solder balls. It is a further object of the invention to provide a method for making an interposer that will result in an interposer that operates with small pitched solder ball arrays. It is a further object of the invention to provide an interposer made by a method in which vias are cut with a laser in the insulating layer. The invention also yields an interposer with a contact well, which does not go all the way through, and which has a layer that blocks off gases.

Additional objects, advantages and novel features of the invention will be set forth in part in the description which follows and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

The device includes a method of making an interposer, an interposer made by a specified method, as well as an interposer structure. The goal of interposers is to be able to contact electrodes that are closer and closer together. At present, the limit of technology is for an interposer to effectively contact electrodes that are 0.75 millimetres apart. This is called a pitch of 0.75, and refers to the distance from the center of one ball feature to the center of an adjacent ball feature. The present invention provides an interposer that can be smaller than a 0.75 pitch, as well as a method of making such an interposer.

The invention is an interposer which includes an upper contact pad and a lower contact pad. The two contact pads are connected by connecting posts that penetrate through an insulative planar layer. The insulative planar layer has vias that are drilled and through which the connecting posts of each interposer extend. The upper contact pad, lower contact pad, and connecting posts are made of copper. An advantage of this design is that the well of the upper contact pad serves to make a good connection with a solder ball type electrode.

Since the insulative planar layer separates the upper contact pad and the lower contact pad, the solder ball is protected from any off gassing from the lower contact pad.

An optional feature of the interposer is to include an elastomeric pad attached to either the upper contact pad or the lower contact pad. The elastomeric pad includes metallic granules that contribute to the conductivity of the elastomeric pad. The elastomeric pad is configured so that it is conductive even when not under pressure. It is designed to be compressed by about thirty percent of its length.

Another optional feature for the interposer is to include an expansion limiting device around each of the elastomeric pads. The expansion limiting device can be a hard stop layer. The hard stop layer is a layer that has holes corresponding to each elastomeric pad. The elastomeric pads protrude through the holes in the hard stop layer. When pressure is applied to the elastomeric pads, the hard stop layer allows the elastomeric pad to expand, but limits their expansion. The hard stop layer can be constructed so that each of the hard stop passages when fitted around the elastomeric pad leaves a small gap between the hard stop material and the elastomeric pad. The upper and lower contact pads of the interposer can be coated with a conductive metal. This is typically nickel, and the nickel may be itself coated with a conductive metal such as gold.

The upper contact pad has an exterior form which surrounds a well area. The top pad can be different then the bottom pad in shape, size and position. This shape helps create a better connection between ball electrodes and the upper contact surface. The ball electrode partially protrudes into the well, and is contacted by the inside edges of the upper contact pad body. These sharp edges tend to scrape away or penetrate any oxidation that might be present on the ball electrode. They also serve as a self-centering mechanism with the solder ball electrode, so that if the solder ball electrode is off in alignment slightly from the upper contact pad, the well and the inner edges of the upper contact pad help to realign the ball for positive connection.

The interposer of the invention may be made by the following method or process. First, an insulative layer is provided. The insulative layer has a layer of copper bonded to both the top and bottom surfaces. The next step involves using a laser to drill vias through the insulative layer and through the layers of copper. The vias are positioned so that they will serve to connect the upper and lower contact pads of the interposer at a later date. The next step is to coat all surfaces of the insulative layer with a layer of copper, which is typically added by a chemical coating method or by electrolysis. This forms a thin layer of copper over the inside of the vias and over the top surfaces of the upper and lower copper layer.

The next step is to add a layer of photoresist to both the upper and lower surfaces of the insulative layer. The next step is to use artwork to selectively expose the photoresist layers to light, using conventional masking techniques. This artwork exposes the photoresist around an upper contact pad and the central well. It also exposes the photoresist that surrounds the lower contact pad. The lower and upper contact pads are positioned on opposite sides of the insulative sides from each other so that the vias connected the upper contact pad and the lower contact pad join the two together. Laser Direct Imagining may also be used. LDI is a method that uses a laser to expose the photo resist with out using artwork. This will save a step of producing the file and is more accurate. The next step is to chemically develop the photoresist so that the areas that are unexposed to light are chemically removed. If the LDI were used, this would remove areas that are exposed to light. This step removes the upper contact pad and the lower contact pad areas of each interposer. Although this method describes the making of one interposer, it is to be understood that typically a number of interposers will be formed on one unit of insulative layer. This unit of insulative layer can be a small piece, roughly the size of a postage stamp, on which may be mounted numerous interposers. Thus, the term "interposer" refers to a single interposer as well as to an array of interposers on a unit of insulative material.

The next step involves depositing a layer of copper in those areas that are not covered by photoresist. This results in building up the upper and lower contact pads of each interposer and filling the vias between them with copper. This forms the copper body of one or more interposers on the insulative layer.

The next step is to deposit a layer of nickel on the exposed copper surfaces on the upper and lower surfaces. Since the only exposed copper surfaces on the upper and lower surfaces are the contact pads of the interposer, the contact pads of all of the interposers become coated with a thin layer of nickel.

The next step involves depositing another layer of conductive material on the exposed nickel surfaces. This results in the top and bottom surfaces of the interposers being covered with gold. Other conductive materials could also be utilized to enhance durability and conductivity of the interposers, such as Cobalt.

The next step is to remove the upper and lower layers of photoresist.

After removing the photoresist, the areas of exposed copper are also removed. This removes the copper layers on the top and the bottom of the insulative layer, which were the original layers of copper on the insulative layer.

An optional step to this process is to add a layer of elastomeric material to the upper or lower surface of the interposer. The elastomeric material is filled with suspended metallic granules, which are conductive and form numerous conductive pathways through the elastomeric material.

An array of interposers made by the method described and mounted on an insulative layer can be made, and is the typical form this product takes. The upper contact pad is shown as having an interior chamber or well, which is generally octagonal. This interior chamber can also take many other shapes such as square, triangular, star shaped, hexagonal, and circular. Each of these shapes would serve the function of helping to center the solder ball electrode and to scrape oxidation or to penetrate the oxidation. The may be generally square in outer dimensions. The outer dimension of these interposers can also take other shapes, including square, rectangular, cross shaped, star shaped, round, hexagonal, octagonal, etc. The upper contact pad can have a different shape than the lower contact pad.

Further, the purpose of the foregoing abstract is to enable the United States Patent and Trademark Office and the public generally, and especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

Still other objects and advantages of the present invention will become readily apparent to those skilled in this art from the following detailed description wherein we have shown and described only the preferred embodiment of the invention, simply by way of illustration of the best mode contemplated by carrying out my invention. As will be realized, the invention is capable of modification in various obvious respects all without departing from the invention. Accordingly, the drawings and description of the preferred embodiment are to be regarded as illustrative in nature, and not as restrictive in nature.

DESCRIPTION OF THE PREFERRED EMBODIMENTS

Figure 1:
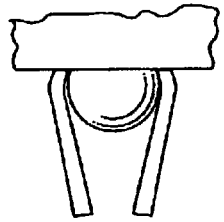
FIG. 1 is a side view of a solder ball with various prior art means of making electrical contact with the solder ball.
Figure 1:
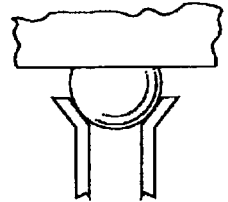
Figure 1:
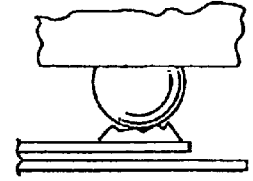
Figure 1:
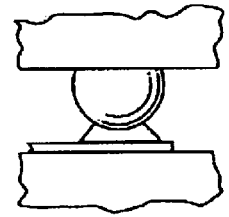
Figure 1:
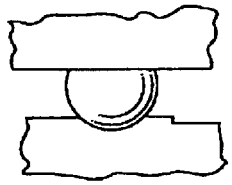
Figure 1:
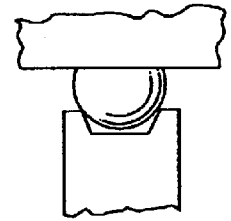

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

FIG. 1 shows a number of concepts that have been utilized or proposed for contacting solder balls in a small array. These include a metal pinch contact, which is like the tips of pair of tweezers gripping the sides of a metal ball. Another is a metal "y" contact that accomplishes about the same thing. The other figures show actual or proposed contact methods.

A problem with the mechanical connections shown in FIG. 1 is that when the solder balls become extremely close together, there is not enough room for these mechanical connections to work.

Figure 2:
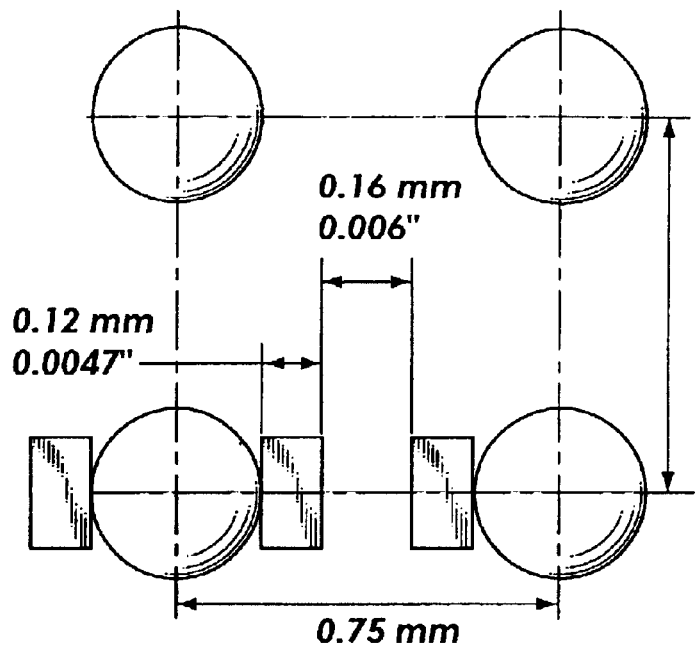
FIG. 2 is a view of prior art mechanical contacts

FIG. 2 shows four solder ball electrodes arranged in a 0.75 mm pitch. The mechanical contacts are shown surrounding two of the solder balls. In this arrangement, there is sufficient space for the mechanical contacts.

Figure 3:
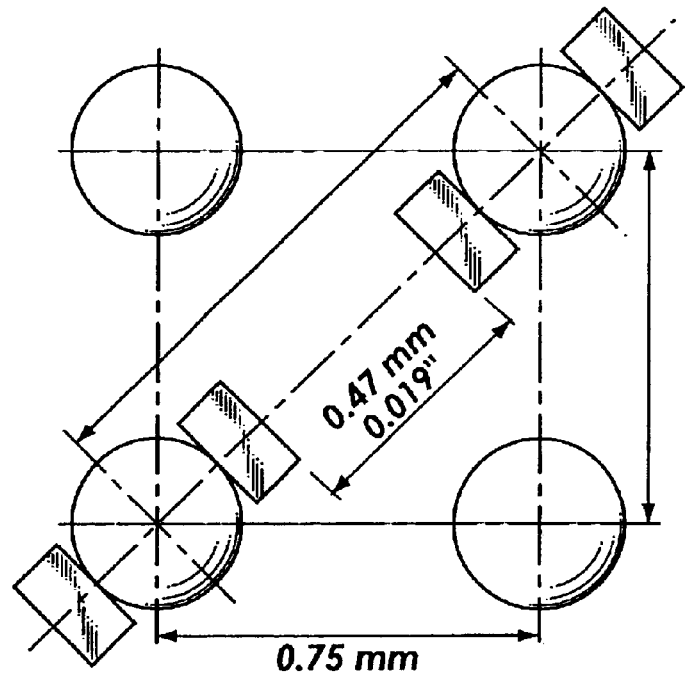
FIG. 3 is a view of prior art mechanical contacts.
Figure 4A:
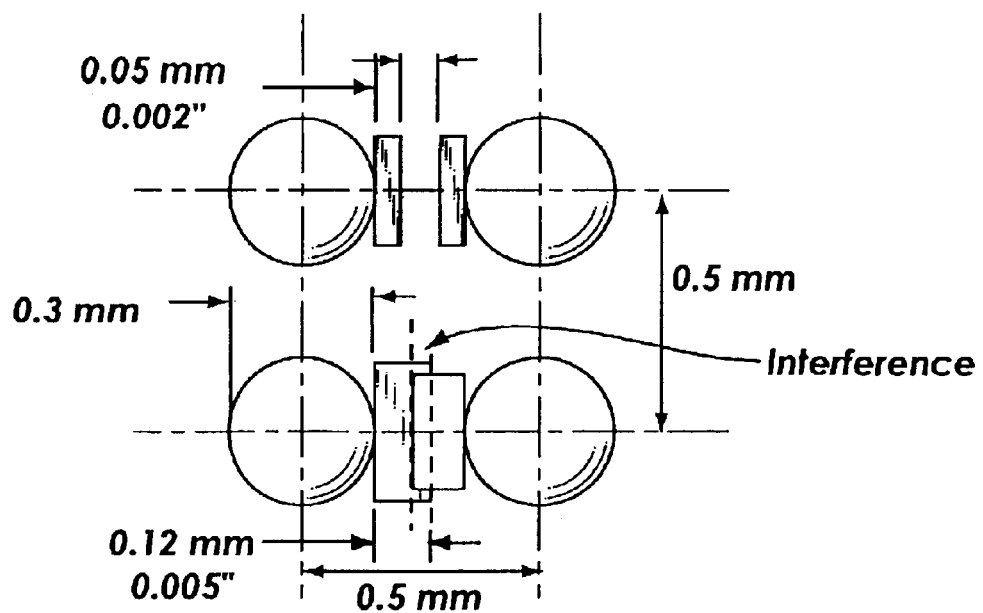
FIG. 4A is a view of prior art mechanical contacts.
Figure 4B:
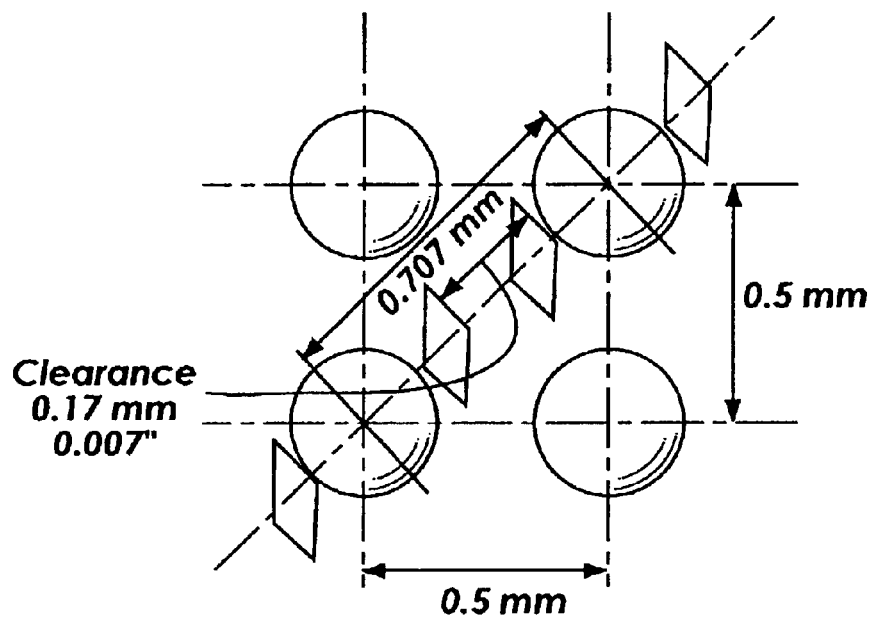
FIG. 4B is a view of prior art mechanical contacts.

FIG. 3 shows that there is even more space if the mechanical contacts are arranged to contact the balls in a diagonal fashion. However, FIGS. 4A and 4B shows that when the solder balls are at a pitch smaller than 0.75, the mechanical connections do not have sufficient clearance to operate. Actuation at a forty-five degree angle to the axis of the array somewhat improves the situation, but mechanical contacts are problematic. For one thing, they have to be extremely accurate, and the solder balls also have to be equally accurate, so that each mechanical contact can make a perfect connection with each solder ball. This requirement for perfect alignment makes mechanical connections increasingly problematic as the pitch between solder balls becomes smaller.

Figure 14:
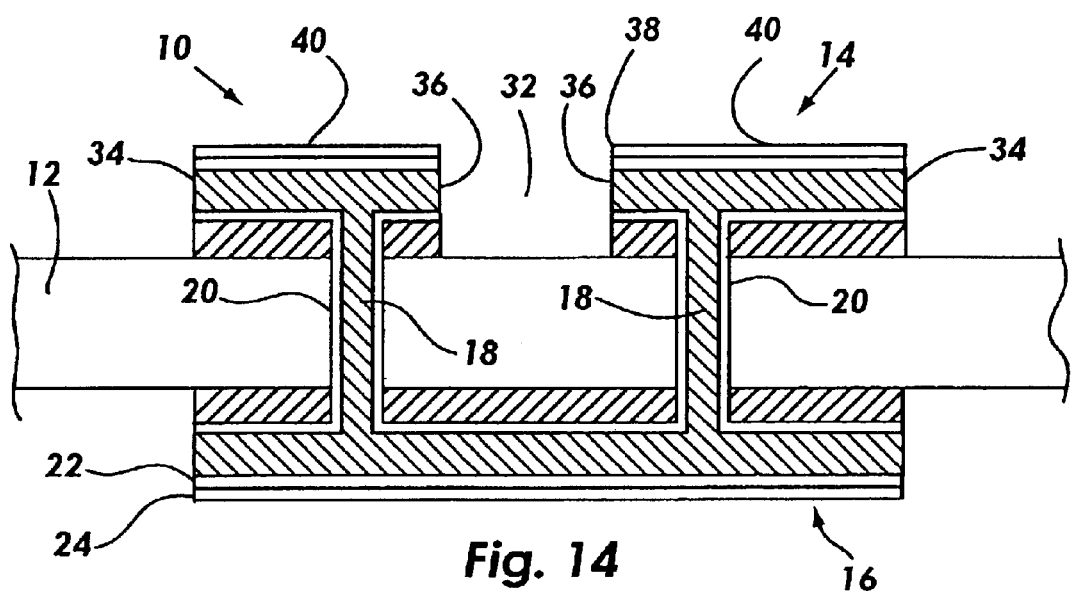
FIG. 14 shows the step of removing the exposed copper surfaces.

The interposer of the invention is shown in cross-section in FIG. 14 and is designated as 10 throughout the figures. It includes an insulative layer 12, an upper contact pad 14, and a lower contact pad 16. The upper and lower contact pads 14 and 16 are connected to each other by a number of connecting posts 18. The connecting posts 18 extend through vias 20, which are laser cut passages through the insulative layer 12. An optional feature of the interposer 10 is a layer of conductive material 22, which is preferably a layer of nickel. An optional feature is a second layer of conductive material, which is preferably a very thin layer of gold 24.

Figure 17:
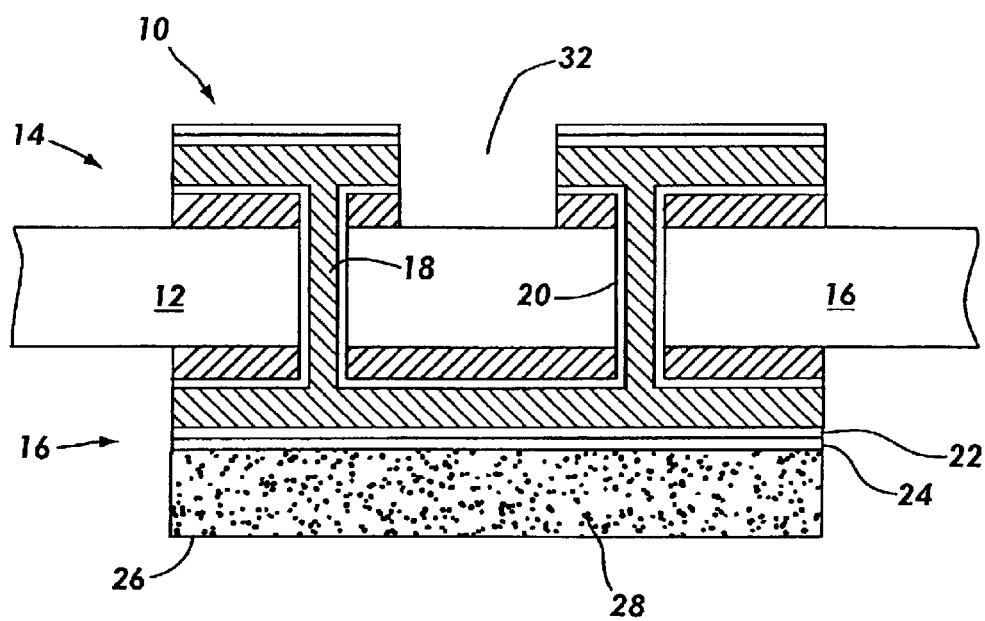
FIG. 17 shows an interposer of the invention with an elastomeric pad.

FIG. 17 shows another version of the interposer, which includes an elastomeric pad 26. The elastomeric pad 26 is made of a conductive elastomer. One method of making the elastomer conductive is to embed within it a large number of metallic granules 28.

Figure 19:
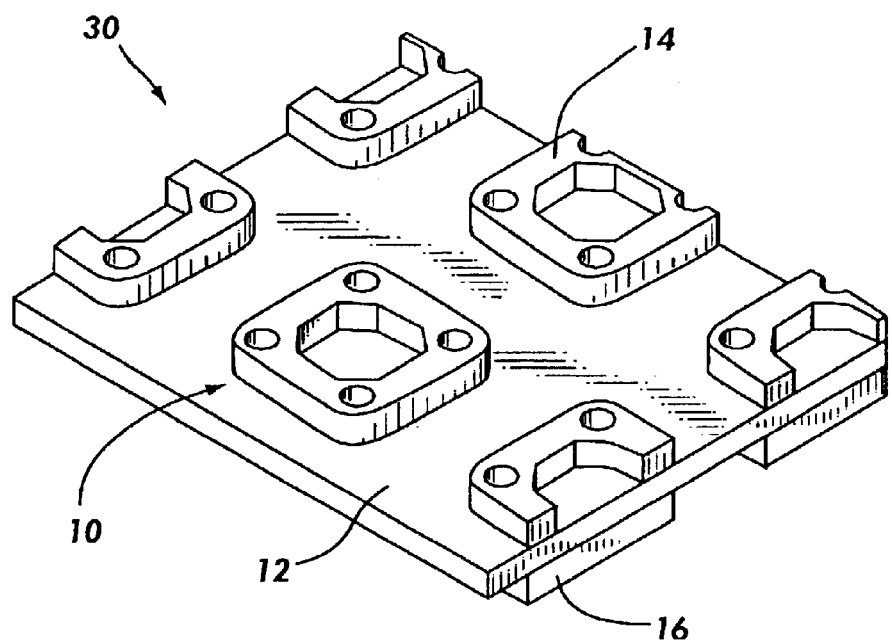
FIG. 19 shows an array of interposers positioned on an insulative layer.

FIG. 19 shows individual interposers 10 that form the interposer array 30. One feature of the interposer is a well 32 formed within the upper contact pad as shown in FIG. 17. The upper contact pad 14 includes an outer side wall 34, an inner side wall 36, and a wall interface 38, which is the interface between the inner side wall 36 and a top surface 40. The wall interface 38 provides a contact edge that, along with the well 32, accomplishes two functions. The wall interface 38 tends to cut through oxidation on a solder ball, which results in good conductivity in this contact. The wall interface 38 combined with the well 32 also helps to center the solder ball or other electrode accurately on the interposer 10. If a solder ball is not in perfect alignment with the interposer 10, the downward pressure of the connection causes the interposer 10 to deflect its position slightly on the insulative layer 12, and provide a better fit for the solder ball or other electrode. The elastomer pad 26 also aids in compensating for contacts that are not perfectly coplanar.

Figure 20:
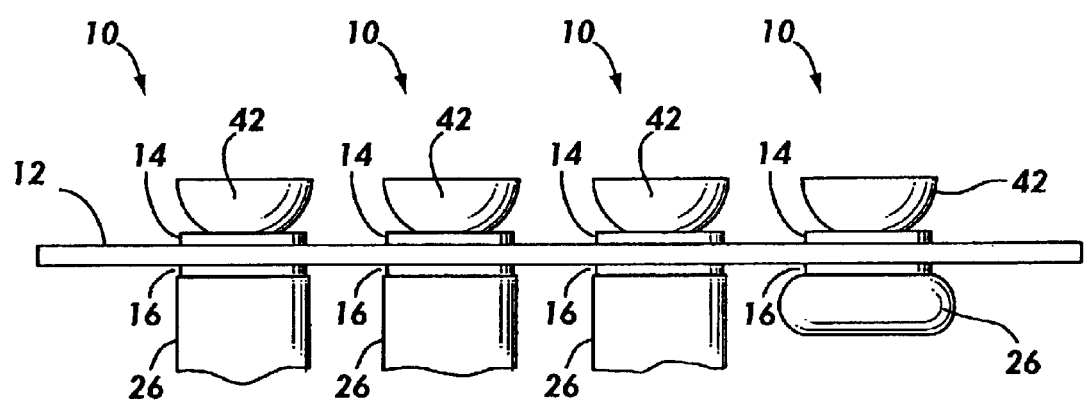
FIG. 20 is a side view of an interposer with an elastomeric pad.

FIG. 19 shows three interposers 10 of the invention with the attached elastomer pads 26. Shown in FIG. 19 is the insulative layer 12 and a number of interposers 10 forming an array 30. Each interposer 10 has an upper contact pad 14 and a lower contact pad 16. FIG. 20 shows the interposers in contact with solder balls 42. One of the interposers shown shows the elastomeric pad 26 compressed as it might be in use. Each of these four interposers also shows a solder ball electrode 42 with which it is in contact. The solder ball electrode is not part of the interposer, but is part of an electrical device or chip that the interposer is in contact with.

Figure 18:
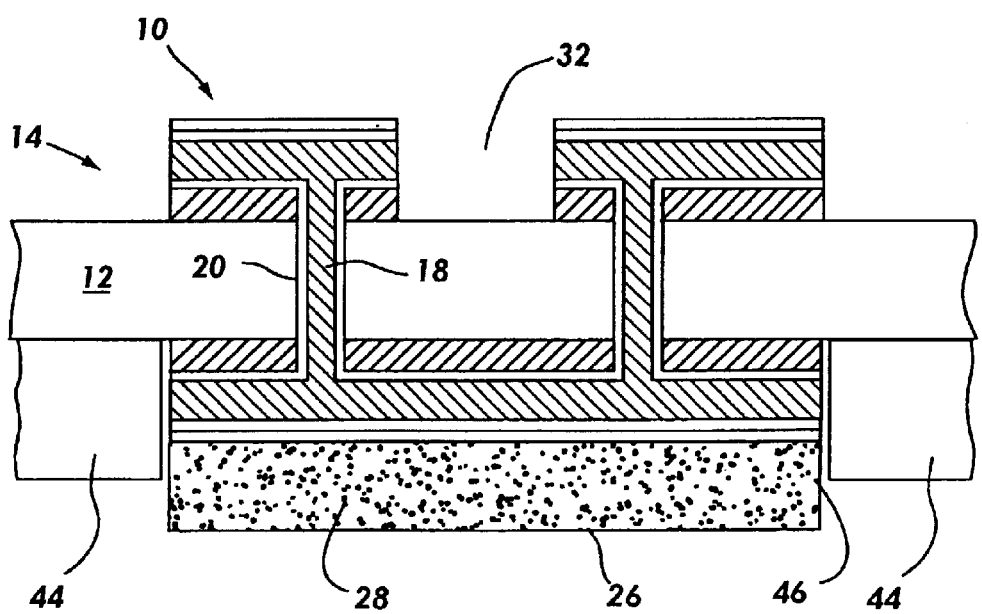
FIG. 18 shows an interposer of the present invention with a hard stop layer.

FIG. 18 shows an optional feature of the device, which is a hard stop layer 44. The hard stop layer is a layer that includes hard stop passages 46, through which the elastomer pad 26 protrudes. The hard stop layer serves to limit the expansion that is possible for the hard stop layer 26, while still allowing the elastomer pad to flex upon contact with an electrode.

For purposes of this description, a mil refers to one thousandths of an inch. The insulative layer used in this method of making an interposer is typically two mils thick kapton material K4 is also a material that can be utilized. The layers of photoresist that are bonded onto the copper layers are also two mils thick. The nickel layer, which is bonded on, is 250 microns thick. The gold layer is twenty microns thick. By the photoresist layer being two mils thick, when the voids are filled and the photoresist layer is stripped off, that leaves interposer features that are two mils high.

A preferred mode of the invention disclosed is an interposer made by the method of the invention. The interposer of the invention is shown in the figures, as well as a way of making the interposer. The interposer is mounted on an insulative layer, and has a contact pad on the upper surface of the insulative later and a contact pad on the lower surface of the insulative layer. The upper and lower contact pads are connected to each other through a connecting post via of copper, which extends through a via in the insulative layer. The upper and lower contact pads are also made of copper. Both the upper and lower surface can also be coated with one or more layers of conductive metals, such as a layer of nickel, gold, silver, or other conductive materials. It is advantageous to coat the copper surfaces with a layer of nickel followed by a layer of gold. The upper contact pad has an exterior form which surrounds a well area. This shape helps create a better connection between ball electrodes and the upper contact surface. The ball electrode partially descends into the well, and is contacted by the inside edges of the upper contact pad body. These sharp edges tend to scrape away or penetrate any oxidation that might be present on the ball electrode. They also serve as a self-centering mechanism with the solder ball electrode, so that if the solder ball electrode is off in alignment slightly from the upper contact pad, the well and the inner edges of the upper contact pad help to realign the ball for positive connection.

Figure 5:
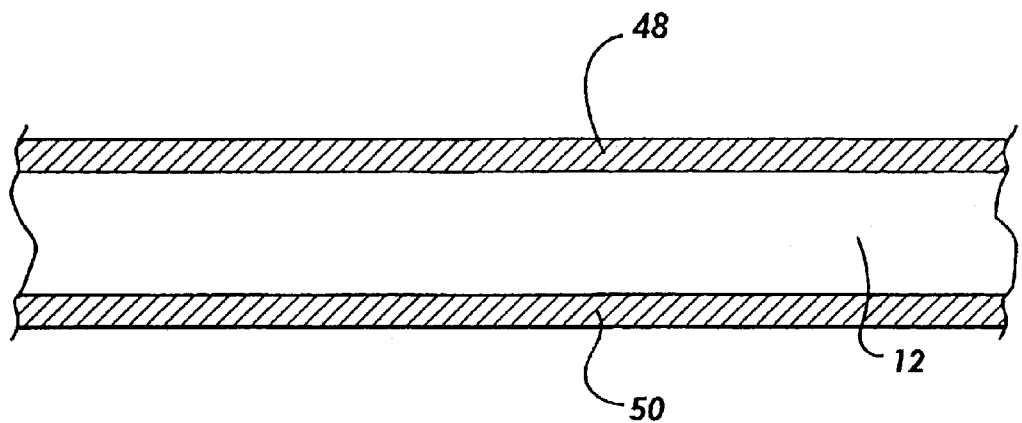
FIG. 5 is a cross-sectional view of the insulative layer of the invention with the upper and lower surfaces coated with copper.
Figure 6:
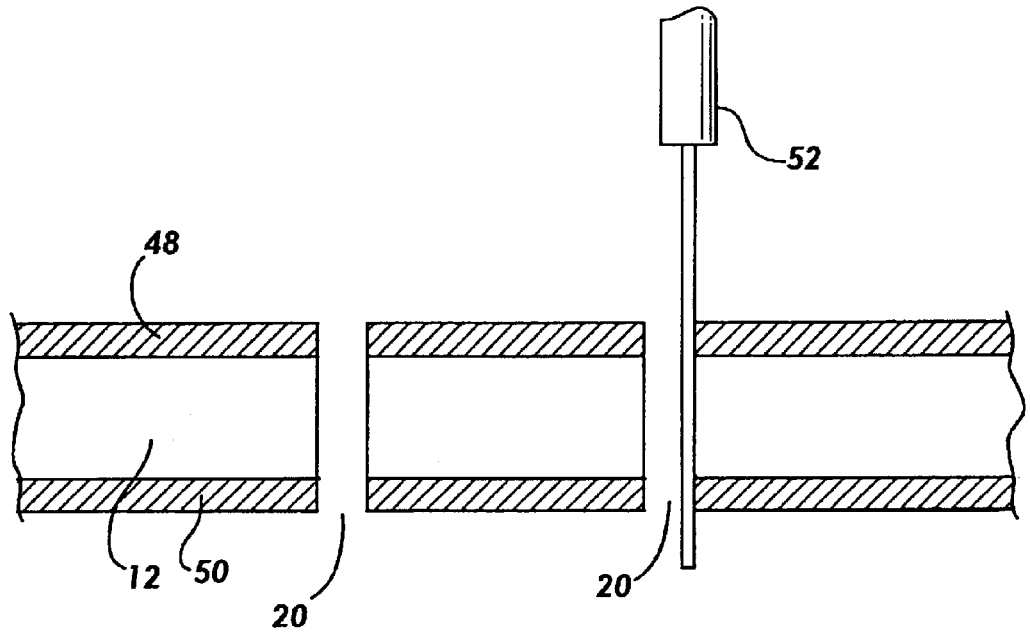
FIG. 6 is a cross-sectional view showing the step in the process of drilling vias with a laser.
Figure 7:
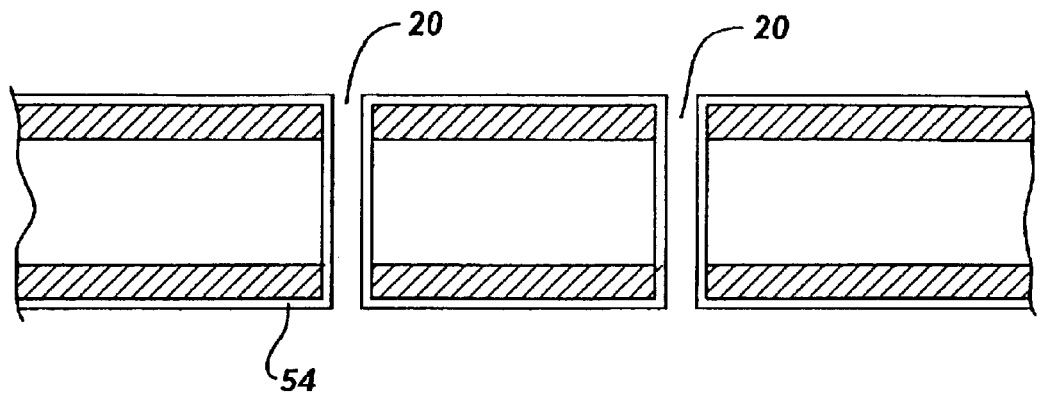
FIG. 7 shows the step of coating the insulative layer and the vias with copper electrolyte.

The interposer of the invention may be made by the following method or process. First, an insulative layer is provided as shown in FIG. 5. This is preferably K4 or Kapton, 2 mils thick. The insulative layer has a layer of copper bonded to both the top and bottom surfaces. These are the first and second copper layers 48, 50, and are preferably 0.365 mils thick, also known as "quarter ounce copper". The next step involves using a laser 52 to drill vias 20 through the insulative layer and through the layers of copper as shown in FIG. 6. The vias are positioned so that they will serve to connect the upper contact pads 14 and lower contact pads 16 of the interposer 10 at a later time. The next step is to coat all surfaces of the insulative layer with a layer of copper, which is typically added by a multi-step chemical process that is known in the industry. This forms a thin layer of copper, a third layer 54, over the inside of the vias and over the top surfaces of the upper and lower copper layer as shown in FIG. 7. This layer 54 is 80 microns thick.

Figure 8:
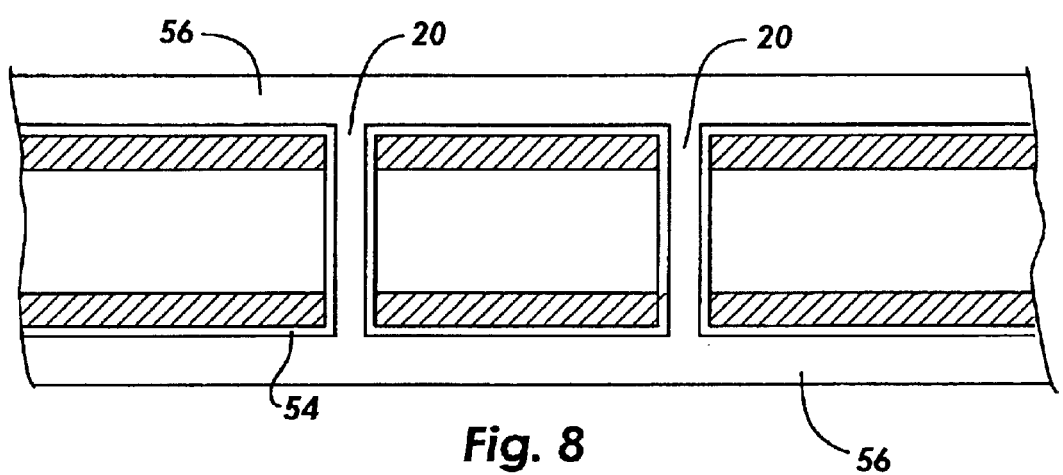
FIG. 8 shows the step of coating the upper and the lower surfaces of the insulative layers with photoresist.
Figure 9:
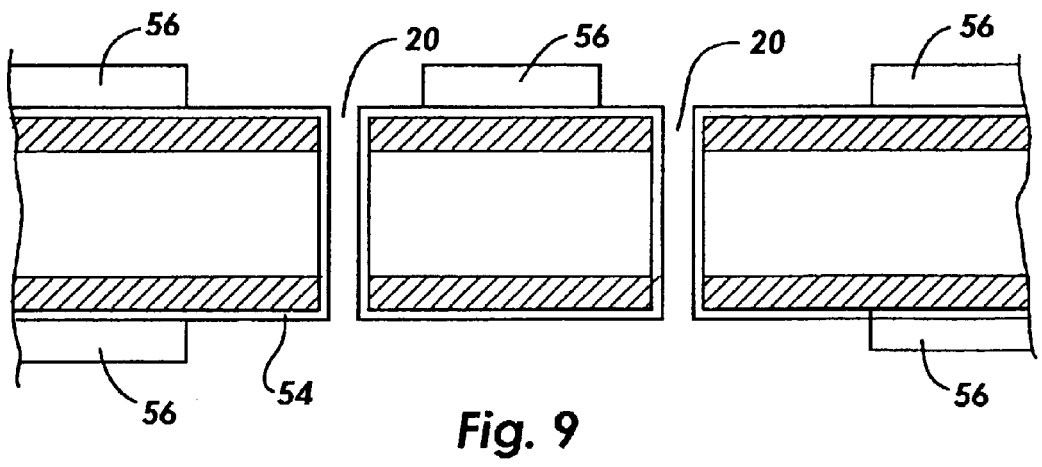
FIG. 9 shows the step of removing the unexposed photoresist portions.

The next step is to add a layer of photoresist 56 to both the upper and lower surfaces of the insulative layer as shown in FIG. 8. The photoresist is 2 mils thick. DSI Technology may also be used to remove photoresist with a laser. The next step is to use artwork to selectively expose the photoresist layers to light, using conventional masking techniques. This artwork exposes the photoresist around an upper contact pad and the central well. It also exposes the photoresist that surrounds the lower contact pad. The lower and upper contact pads are positioned on opposite sides of the insulative sides from each other so that the vias connected the upper contact pad and the lower contact pad join the two together. The next step is to chemically develop the photoresist so that the areas that are unexposed to light are chemically removed, which includes the upper contact pad and the lower contact pad areas of each interposer. This step is shown in FIG. 9. Although this method describes the making of one interposer, it is to be understood that typically a number of interposers will be formed on one unit of insulative layer. This unit of insulative layer can be a small piece, roughly the size of a postage stamp, on which may be mounted numerous interposers. Thus, the interposer 10 refers to a single interposer as well as to an array 30 of interposers on a unit of insulative material.

Figure 10:
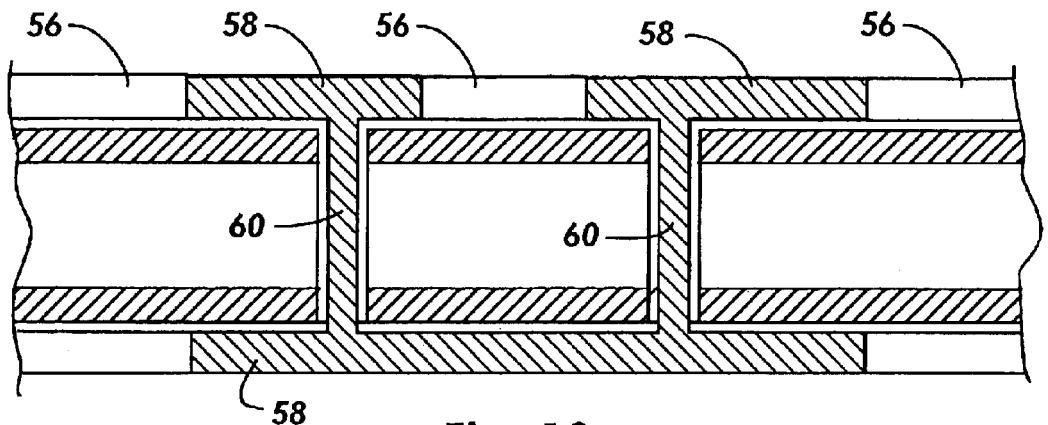
FIG. 10 shows adding copper to vias and contact pad areas.

The next step is shown in FIG. 10 and involves depositing a fourth layer 58 of copper in those areas that are not covered by photoresist. This results in building up the upper and lower contact pads of each interposer and filling the vias between them with copper. The filled vias form connecting posts 60. This forms the copper body of one or more interposers on the insulative layer.

Figure 11:
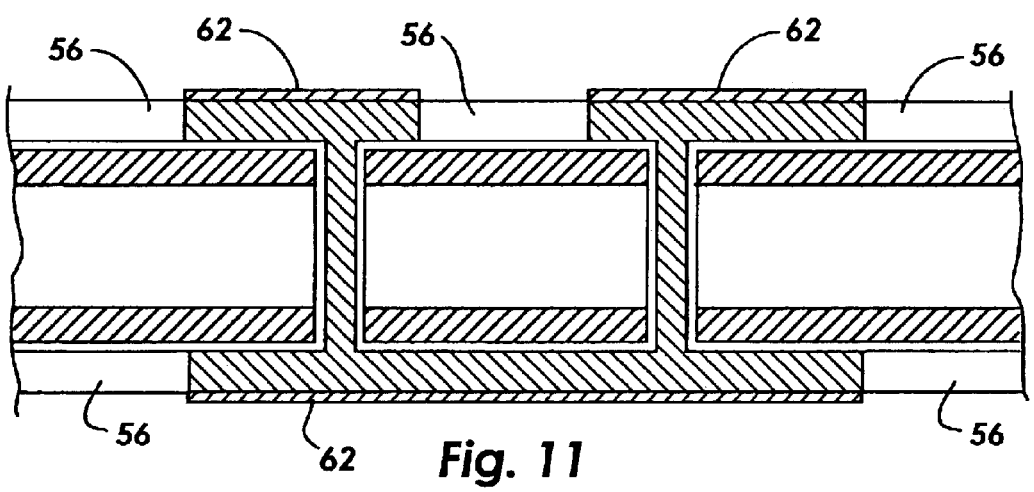
FIG. 11 shows the step of depositing a layer of nickel to the exposed copper.

The next step is to deposit a layer of nickel 62 on the exposed copper surfaces on the upper and lower surfaces, as shown in FIG. 11. This is an optional step, but is preferred. Since the only exposed copper surfaces on the upper and lower surfaces are the contact pads of the interposer, the contact pads of all of the interposers become coated with a thin layer of nickel 62.

Figure 12:
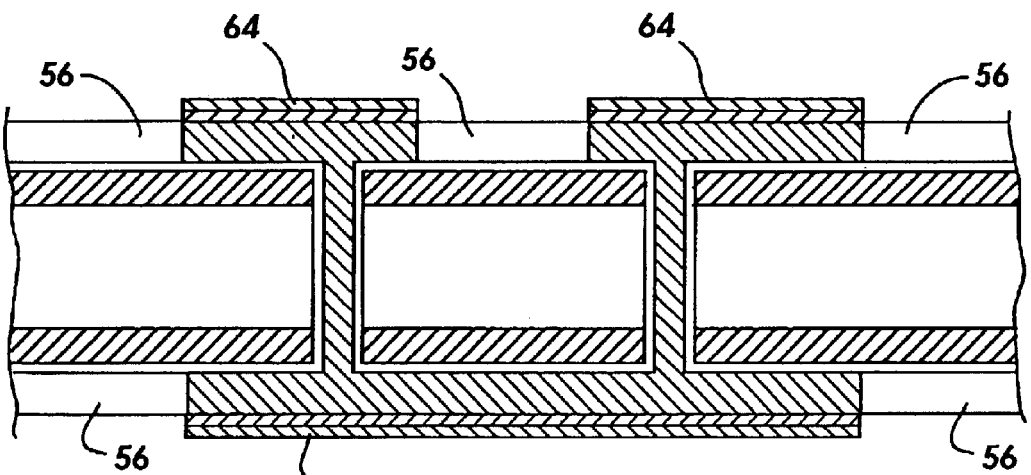
FIG. 12 shows the step of depositing a layer of gold to the exposed copper.

The next step shown in FIG. 12 involves depositing another layer of conductive material 64 on the exposed nickel surfaces. This results in the top and bottom surfaces of the interposers being preferably covered with gold. Other conductive materials could also be utilized to enhance durability and conductivity of the interposers, such as cobalt.

Figure 13:
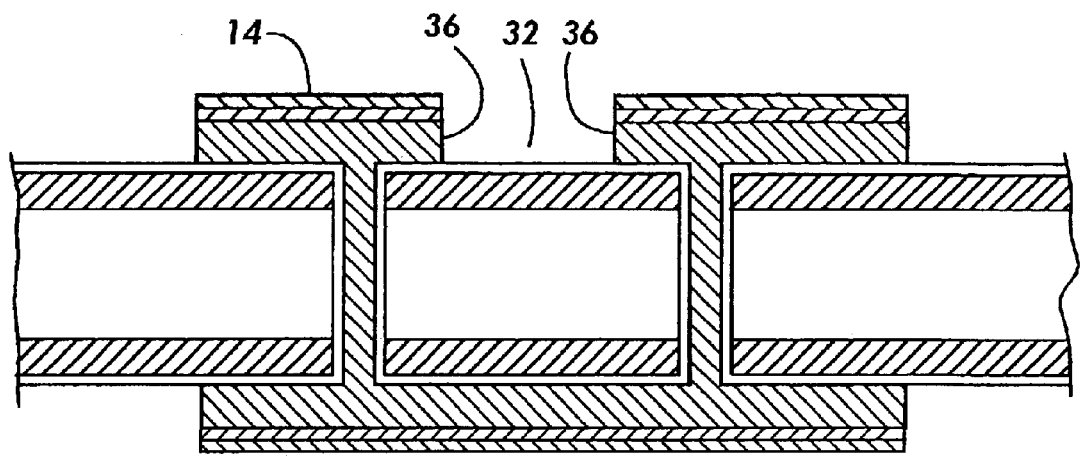
FIG. 13 shows the step of removing the layers of photoresist from the upper and lower surfaces.

The next step is to remove the upper and lower layers of photoresist 56, as shown in FIG. 13. This also exposes the well 32 that is surrounded by the inner side walls 36 of the upper contact pad 14. For certain sizes of interposers, the photoresist 56 in the well 32 may be removed using a laser.

After removing the photoresist, the areas of exposed copper are also removed, in FIG. 14. This removes the copper layers on the top and the bottom of the insulative layer, which were the original layers of copper on the insulative layer. This leaves one or more interposers in the configuration shown in FIG. 14.

An optional step to this process is to add a layer of elastomeric material to the upper or lower surface of the interposer. The elastomeric material is filled with suspended metallic granules, which are conductive and form numerous conductive pathways through the elastomeric material.

Figure 15:
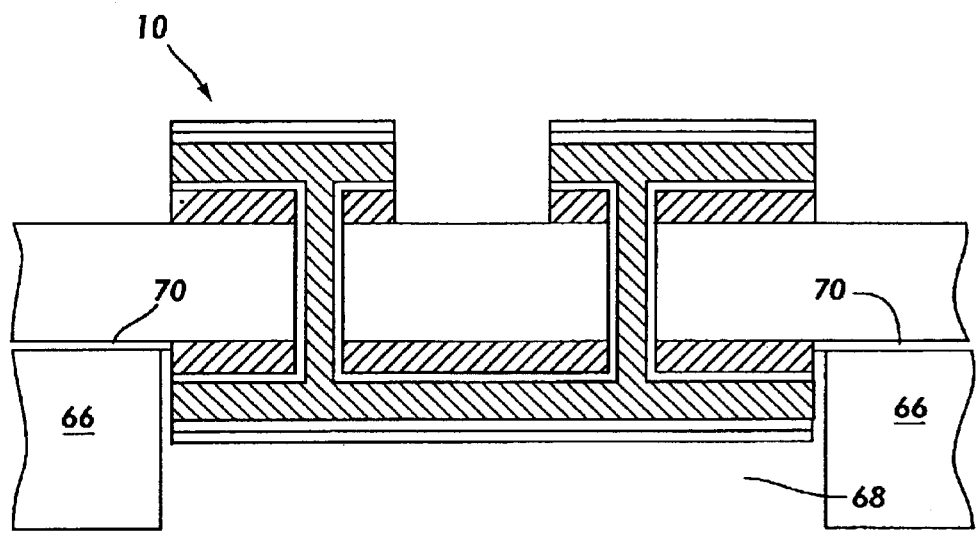
FIG. 15 shows the step of adding a stencil.

The method of adding the elastomeric pad 26 to the interposer 10 starts with the steps shown in FIG. 15. A stencil 66 is applied to the surface to which the elastomeric pad is to be applied. This could be the upper surface or the lower surface, and the lower surface is shown in the figures. The stencil includes stencil passages which correspond to the lower contact pad 16 of each interposer. The stencils are attached to the lower surface of the insulative layer by an adhesive 70.

Figure 16:
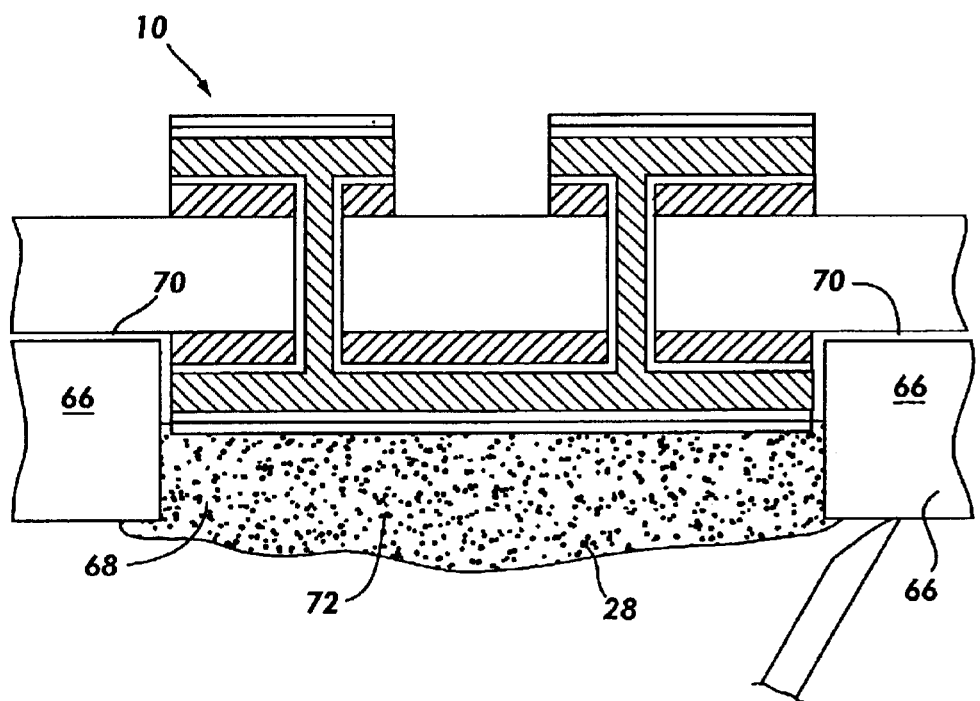
FIG. 16 shows the step of adding elastomeric material.

As shown in FIG. 16, elastomeric material 72 is applied across the surface of the stencil 66, so that the stencil passages 68 are filled with elastomeric material 72. The elastomeric material 72 includes a large number of metallic granules 28, which add to the conductivity of the elastomeric material. The elastomeric material 72 may be scraped or pressed into the stencil passage 68.

FIG. 17 shows the stencil 66 removed, and the adhesive 70 removed from the insulative layer. This leaves an elastomeric pad 26 with enclosed metallic granules 28.

An optional step is shown in FIG. 18. This involves placing a hard stop layer 44 adjacent the insulative layer 12. The hard stop layer 44 includes hard stop passages 46, which correspond to elastomer pads 26. The hard stop layer 44 serves to limit the possible expansion of the elastomeric pad 26 when it is under pressure. A gap is present between the walls of the hard stop passages and the elastomeric material.

FIG. 19 shows an array 30 that includes individual interposers 10.

FIG. 20 also shows a finished array of interposers. This array does not include the hard stop layer, but does include interposers with an elastomer pad 26.

An array of interposers made by the method described and mounted on an insulative layer can be made, and is the typical form this product takes. The upper contact pad is shown as having an interior chamber or well, which is generally octagonal. This interior chamber can also take many other shapes such as square, triangular, star shaped, hexagonal, and circular. Each of these shapes would serve the function of helping to center the solder ball electrode and to scrape oxidation or to penetrate the oxidation. The may be generally square in outer dimensions. The outer dimension of these interposers can also take other shapes, including rectangular, cross shaped, star shaped, round, hexagonal, octagonal, etc. The upper contact pad 14 can be different size and shape than the lower contact pad 16.

While there is shown and described the present preferred embodiment of the invention, it is to be distinctly understood that this invention is not limited thereto but may be variously embodied to practice within the scope of the following claims. From the foregoing description, it will be apparent that various changes may be made without departing from the spirit and scope of the invention as defined by the following claims.

We claim:

1. The method of making one or more interposers which comprises the following steps:

providing an insulative layer with a top surface and a bottom surface, with a first layer of copper bonded to said top surface and a second layer of copper bonded to said bottom surface;

drilling a plurality of vias in said insulative layer for each interposer;

coating the inside surface of the vias and the top and bottom surface of the insulative layer with a third layer of copper;

adding an upper layer of photoresist to said top surface, and a lower layer of photoresist to said bottom surface of the of the insulative layer;

using artwork to selectively expose the photoresist layers to light, thereby exposing photoresist around an upper contact pad which defines a central well, and an area around a lower contact pad, with the upper contact pad and the lower contact pad positioned on opposite sides of the insulative layer from each other, and with the vias connecting the upper contact pad and the lower pads, for each interposer;

chemically developing the photoresist, so that areas unexposed to light are chemically removed, including the upper contact pad and the lower contact pad areas of each interposer;

depositing a fourth layer of copper in areas not covered by photoresist, thus building up said upper and lower contact pads of each interposer and filling said vias between the upper and lower contact pads of each interposer, thus forming the copper body of one or more interposers, each with an upper contact pad which defines a central void, and a lower contact pad, with the contact pads of each interposer connected by a plurality of copper connecting post filling said vias;

depositing one or more layers of conductive metal on exposed copper surfaces of an upper or lower contact pad, or both, for improved durability;

removing the upper and lower photoresist layers;

removing the first and second copper layers, which leaves said insulative layer with one or more interposers, with each interposer comprising an upper contact pad which surrounds and defines an inner well, and a lower contact pad, with said upper and lower contact pads connected by a plurality of vias, in which said inner well is isolated from said lower contact pad by said insulative layer;

forming a stencil which is thicker than said lower contact pads and in which are defined a stencil passage corresponding to each lower contact pad of each interposer, and attaching said stencil to said bottom surface of said insulative layer, so that each lower contact pad is positioned in a corresponding stencil passage;

applying a conductive elastomeric material to said stencil, so that said stencil passages are filled with said conductive elastomeric material; and removing said stencil, leaving each lower conductive pad with an attached conductive elastomeric pad.

2. The method of claim 1 in which the step of drilling said vias is performed by a laser.

3. The method of claim 1 in which said third layer of copper is deposited by chemical means.

4. The method of claim 1 in which nickel is deposited as the conductive metal coating on said exposed copper contact pad.

5. The method of claim 4 in which gold is deposited on said nickel as a second conductive metal coating on said exposed copper contact pad.

6. The method of claim 1 which includes the step of applying said conductive elastomeric material in a paste or liquid form, which is spread over said stencil to fill said stencil passages.

7. The method of claim 6 which includes the step of spreading said paste or liquid conductive elastomer by troweling across said stencil to fill said stencil passages.

8. The method of claim 6 which includes the step of curing said conductive elastomer.

9. The method of claim 6 which includes the step of applying an expansion limiter around each of said elastomeric pads.

10. The method of claim 9 which includes the step of attaching an expansion limiter in the form of a hard stop layer, which is applied to said bottom surface of said insulative layer, with hard stop passages defined in said hard stop layer which correspond to said elastomeric pads, so that said hard stop passages surround said elastomeric pads and limit the possible expansion of said elastomeric pads.

11. The method of claim 10 which includes the step of configuring said hard stop passages so that said elastomeric pads are surrounded by said hard stop layer with a gap around each elastomeric pad.

12. The method of claim 1 which includes the step of applying conductive elastomer which contains metallic granules which enhance the conductivity of said elastomer.

13. The method of claim 1 which includes the step of forming conductive elastomer pads which are conductive upon contact with an electrode, and do not require compression to become conductive.

14. The method of claim 1 which includes the step of planing smooth said elastomer pads before removing said stencil.

* * * * *